(12) United States Patent
Xue et al.

(10) Patent No.: US 11,352,713 B2
(45) Date of Patent: Jun. 7, 2022

(54) HEAT SHIELD STRUCTURE FOR SINGLE CRYSTAL PRODUCTION FURNACE AND SINGLE CRYSTAL PRODUCTION FURNACE

(71) Applicants: Shanghai Institute of Microsystem and Information Technology, Chinese Academy of Sciences, Shanghai (CN); Zing Semiconductor Corporation, Shanghai (CN)

(72) Inventors: Zhongying Xue, Shanghai (CN); Tao Wei, Shanghai (CN); Xing Wei, Shanghai (CN); Zhan Li, Shanghai (CN); Yun Liu, Shanghai (CN); Minghao Li, Shanghai (CN)

(73) Assignees: Shanghai Institute of Microsystem and Information Technology, Chinese Academy of Sciences, Shanghai (CN); Zing Semiconductor Corporation, Shanghai (CN)

( * ) Notice: Subject to any disclaimer, the term of this patent is extended or adjusted under 35 U.S.C. 154(b) by 37 days.

(21) Appl. No.: 17/139,975

(22) Filed: Dec. 31, 2020

(65) Prior Publication Data
US 2022/0002898 A1    Jan. 6, 2022

(30) Foreign Application Priority Data
Jul. 1, 2020    (CN) .......................... 202010621640.X (51) Int. Cl.
*C30B 15/14*    (2006.01)
*C30B 15/10*    (2006.01)
*C30B 29/06*    (2006.01)

(52) U.S. Cl.
CPC .............. *C30B 15/10* (2013.01); *C30B 15/14* (2013.01); *C30B 29/06* (2013.01)

(58) Field of Classification Search
CPC ......... C30B 15/10; C30B 15/14; C30B 29/06; Y10T 117/1068
See application file for complete search history.

(56) References Cited

U.S. PATENT DOCUMENTS

| | | | |
|---|---|---|---|
| 5,373,805 A * | 12/1994 | Takano | ................... C30B 15/00 117/214 |
| 6,197,111 B1 * | 3/2001 | Ferry | ...................... C30B 15/14 117/217 |
| 6,379,460 B1 * | 4/2002 | Harada | ................... C30B 15/14 117/200 |

(Continued)

*Primary Examiner* — Robert M Kunemund (57) ABSTRACT

Disclosed a heat shield structure for a single crystal production furnace, which is provided above a melt crucible of a single crystal production furnace and comprises an outer housing and a heat insulation plate disposed within the outer housing. A bottom outer surface of the outer housing faces an interior of the melt crucible, and an angle formed between a plane in which the heat insulation plate is located and a plane in which a bottom of the outer housing is located is an acute angle and faces an outer surface of single crystal silicon. The heat shield design is changed, a heat absorbing plate is additionally provided for transferring heat absorbed to the single crystal silicon, a heat channel is formed in the heat shield, so that a pulling rate is controlled, which improves radial mass uniformity of the single crystal silicon.

18 Claims, 3 Drawing Sheets

(56) References Cited

U.S. PATENT DOCUMENTS

| | | | | |
|---|---|---|---|---|
| 6,579,362 B2* | 6/2003 | Ferry | ............... | C30B 15/14 |
| | | | | 117/213 |
| 7,077,905 B2* | 7/2006 | Shimosaka | ............ | C30B 15/14 |
| | | | | 117/30 |
| 7,294,263 B2* | 11/2007 | Johnson | ............ | B01D 35/02 |
| | | | | 210/232 |
| 8,147,613 B2* | 4/2012 | Kulkarni | ............ | C30B 15/206 |
| | | | | 117/216 |
| 8,216,372 B2* | 7/2012 | Cho | ............... | C30B 15/14 |
| | | | | 117/917 |
| 9,217,208 B2* | 12/2015 | Hoshi | ............... | C30B 15/20 |

* cited by examiner

HEAT SHIELD STRUCTURE FOR SINGLE CRYSTAL PRODUCTION FURNACE AND SINGLE CRYSTAL PRODUCTION FURNACE

CROSS REFERENCE TO RELATED APPLICATIONS

The present application claims the benefit of Chinese Patent Application No. 202010621640.X filed on Jul. 1, 2020, the contents of which are incorporated herein by reference in their entirety.

TECHNICAL FIELD

The present invention relates to the field of manufacturing equipment of semiconductors, and in particular to a heat shield structure for a single crystal production furnace and a single crystal production furnace.

BACKGROUND

Monocrystalline silicon plays an irreplaceable role as a material basis for sustainable development of industries of modern communication technology, integrated circuits, solar cells, and so on. At present, main methods for growing monocrystalline silicon from melt include the Czochralski method and the zone melting method. The Czochralski method for growing monocrystalline silicon has advantages of simple equipment and processes, easy to achieve automatic control, high production efficiency, easy preparation of a large-diameter monocrystalline silicon, as well as fast crystal growth, high crystal purity and high integrity, so that the Czochralski method has been rapidly developed.

To produce monocrystalline silicon in a single crystal production furnace using the Czochralski method, common silicon materials need to be melted and then recrystallized. According to the crystallization law of monocrystalline silicon, a raw material is heated and melted in a crucible, with a temperature controlled to be slightly higher than a crystallization temperature of silicon single crystal, to ensure that the molten raw material can be crystallized on the surface of the solution. The crystallized single crystal is pulled out of the liquid level through a pulling system of the Czochralski furnace, cooled and shaped under the protection of an inert gas, and finally crystallized into a crystal with a cylindrical body and a cone tail.

Monocrystalline silicon is grown in the heat field of the single crystal furnace, and thus the quality of the heat field significantly influences the growth and quality of the monocrystalline silicon. A good heat field can not only allow a single crystal to grow successfully, but also produce a high-quality single crystal. When heat field conditions are not sufficient, a single crystal may not be grown, and even though a single crystal is grown, the single crystal may be transformed to a polycrystal or has a structure with a large number of defects due to crystal transformation. Therefore, it is a very critical technology in a Czochralski monocrystalline silicon growth process to find better conditions and best configuration of the heat field.

In the design of an entire heat field, the most critical is the design of a heat shield. Firstly, the design of the heat shield directly influences the vertical temperature gradient of the solid-liquid interface, and determines the crystal quality by influencing a V/G ratio with changed temperatures. Secondly, the design of the heat shield will influence the horizontal temperature gradient of the solid-liquid interface, and control the quality uniformity of the entire silicon wafer. Finally, a properly designed heat shield will influence the heat history of the crystal, and control nucleation and growth of defects inside the crystal. Therefore, the design of the heat shield is very critical in the process of preparing high-grade silicon wafers.

At present, an outer layer of a commonly used heat shield is a SiC coating layer or pyrolytic graphite, and an inner layer the commonly used heat shield heat-insulating graphite felt. The heat shield which is cylindric is positioned in an upper portion of the heat field. A crystal bar is pulled out of the cylindric heat shield. The graphite of the heat shield which is close to the crystal bar has a lower heat reflectivity and absorbs heat emitted from the crystal bar. The graphite on the outside surface of the heat shield usually has a higher heat reflectivity, which is beneficial to reflect back the heat emitted from the melt, thereby improving the heat insulation performance for the heat field and reducing power consumption of the whole process. However, the existing heat shields still have the defect of non-uniform temperature gradient. Therefore, a heat field structure for a single crystal production furnace and a single crystal production furnace, which can effectively improve uniformity of temperature gradient, are needed.

SUMMARY

An objective of the present invention is to provide a heat shield structure for a single crystal production furnace and a single crystal production furnace, which are simple in structure. The heat shield is changed in design, the heat absorbing plate is additionally provided for transferring the absorbed heat to monocrystalline silicon, and a heat channel is formed in the heat shield, so that the radial temperature gradient of the monocrystalline silicon can be optimized, thereby realizing controlling of the pulling rate and further improving radial mass uniformity of the monocrystalline silicon.

In order to overcome the abovementioned problems in the prior art, the following technical solutions are provided in the present invention.

A heat shield structure for a single crystal production furnace is provided, wherein the heat shield structure is provided above a melt crucible of a single crystal production furnace and comprises an outer housing and a heat insulation plate disposed within the outer housing; a bottom outer surface of the outer housing faces interior of the melt crucible, and an angle formed between a plane in which the heat insulation plate is located and a plane in which a bottom of the outer housing is located is an acute angle and faces an outer surface of monocrystalline silicon.

In a preferred embodiment, an inner housing is further comprised, the inner housing is provided within the outer housing and in a lower portion of the outer housing; the inner housing is provided with a cavity; the heat insulation plate is provided in the cavity or is provided in a space between the inner housing and the outer housing; and the space between the inner housing and the outer housing is filled with a heat insulation material.

In a preferred embodiment, a heat absorbing plate is further comprised, which is provided within the inner housing and on a bottom of the inner housing.

In a preferred embodiment, an angle between a plane in which the heat insulation plate is located and a plane in which the heat absorbing plate is located is in a range of greater than 0° and smaller than or equal to 30°.

In a preferred embodiment, the heat insulation plate at least comprises two heat insulation film assemblies, and the heat insulation film assemble includes a first refractive layer having first refractivity and a second refractive layer having second refractivity which is different from the first refractivity.

In a preferred embodiment, the first refractive layer is made of silicon or molybdenum, and the second refraction layer is made of quartz.

the heat insulation plate at least comprises a supporting layer and a heat insulation film assembly, and the heat insulation film assembly includes a first refractive layer having first refractivity and a second refractive layer having second refractivity which is different from the first refractivity; and the supporting layer, the first refractive layer and the second refractive layer are attached and connected in sequence.

In a preferred embodiment, the first refractive layer is made of silicon, the second refraction layer is made of quartz or silicon nitride, and the supporting layer is made of silicon.

In a preferred embodiment, shells of the outer housing and the inner housing each have a dismountable structure.

A single crystal production furnace according to the present invention comprises: a furnace body including a furnace body wall and an accommodation cavity surrounded by the furnace body wall; a melt crucible disposed within the accommodation cavity and for containing melt; a heater disposed within the accommodation cavity and around the melt crucible, and suitable for providing a heat field of the melt crucible; and a heat shield device for a single crystal production furnace above, in which a bottom outer surface of an outer housing faces interior of the melt crucible.

From the specific embodiments of the present invention, the present invention has the following beneficial effects:

(1) In the heat shield structure for a single crystal production furnace and the single crystal production furnace, which are simple in structure, the heat shield is changed in design, the heat absorbing plate is additionally provided for transferring the absorbed heat to monocrystalline silicon, and a heat channel is formed in the heat shield, so that the radial temperature gradient of the monocrystalline silicon can be optimized, thereby realizing controlling of the pulling rate and further improving radial mass uniformity of the monocrystalline silicon;

(2) The heat insulation plate composed of at least two refractive layers with different refractivity is used to reflect heat emitted from the melt to the periphery of single crystal silicon; the heat insulation plate with such structure has a higher heat reflection efficiency, which is beneficial for optimizing the radial temperature gradient of the monocrystalline silicon;

(3) The inner housing is additionally provided and cooperates with the heat insulation plate to optimize the radial temperature gradient of the monocrystalline silicon, while the space between the outer housing and the inner housing is filled with a heat insulation material to optimize the longitudinal temperature gradient; and (4) The heat absorbing plate is additionally provided to collect the heat emitted from the melt, which is beneficial for subsequently passing the heat to the monocrystalline silicon, thereby improving heat transmission efficiency.

BRIEF DESCRIPTION OF DRAWINGS

In order to more clearly illustrate the technical solutions of the present invention, the accompanying drawings that are used in the description of the embodiments or the prior art will be briefly introduced hereafter. Obviously, the accompanying drawings in the following description are only some embodiments of the present invention, and other accompanying drawings can be obtained based on these drawings by those of ordinary skill in the art without creative work.

Reference signs are listed as follows:

1—Heat insulation plate, 11—First refractive layer, 12—Second refractive layer, 13—Supporting layer, 2—Outer housing, 3—Inner housing, 4—Heat insulation material, 5—Heat absorbing plate, 6—Melt crucible, 7—Single crystal silicon, and 8—Heat shield structure.

DETAILED DESCRIPTION

Hereafter, the technical solutions according to embodiments of the present invention will be described clearly and thoroughly with reference to accompanying drawings. Obviously, the described embodiments are only part of, not all of, the embodiments of the present invention. Based on the embodiments of the present invention, all other embodiments obtained by those of ordinary skill in the art without creative work shall fall within the protection scope of the present invention.

An objective of the present invention is to provide a heat shield structure for a single crystal production furnace and a single crystal production furnace, which are simple in structure. The heat shield is changed in design, the heat absorbing plate is additionally provided for transferring the absorbed heat to monocrystalline silicon, and a heat channel is formed in the heat shield, so that the radial temperature gradient of the monocrystalline silicon can be optimized, thereby realizing controlling of the pulling rate and further improving radial mass uniformity of the monocrystalline silicon.

In order to understand the above objective, features and advantages of the present invention clearer and easier, the present invention will be further illustrated below with reference to the drawings and the embodiments.

Embodiment 1

Figure 1:
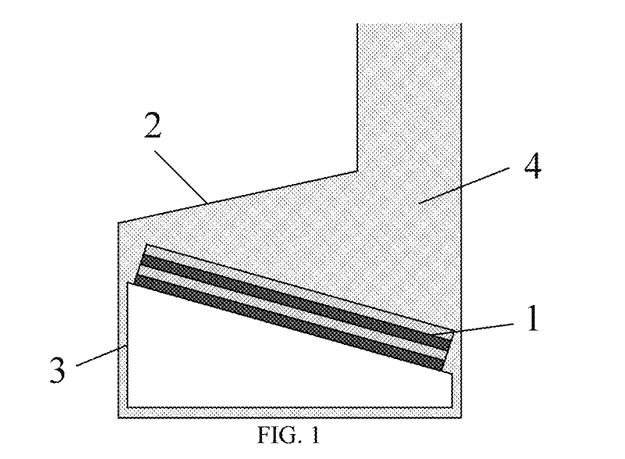
FIG. 1 is a partial section view showing a structure of a heat shield for a single crystal production furnace according to Embodiment 1 of the present invention.
Figure 4:
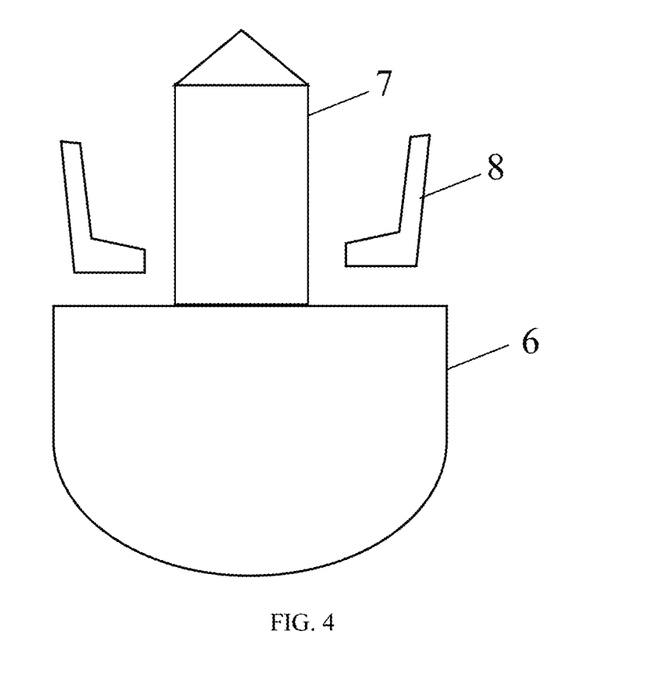
FIG. 4 is a schematic structural diagram of a single crystal production furnace according to the present invention.

Refer to FIGS. 1 and 4. A heat shield structure for a single crystal production furnace is provided in the embodiment. The heat shield structure 8 is provided above a melt crucible 6 of a single crystal production furnace and comprises an outer housing 2 and a heat insulation plate 1 disposed within the outer housing 2. A bottom outer surface of the outer housing 2 faces interior of the melt crucible 6, and an angle formed between a plane in which the heat insulation plate 1 is located and a plane in which a bottom of the outer housing 2 is located is an acute angle and faces an outer surface of monocrystalline silicon 7. The heat shield is changed in design, the heat absorbing plate is additionally provided for transferring the absorbed heat to monocrystalline silicon, and a heat channel is formed in the heat shield, so that the radial temperature gradient of the monocrystalline silicon can be optimized, thereby realizing controlling of the pulling rate and further improving radial mass uniformity of the monocrystalline silicon.

An inner housing 3 is further comprised which is provided within the outer housing 2 and in a lower portion of the outer housing 2. The inner housing 3 is provided with a cavity, and the heat insulation plate 1 is provided in the cavity or is provided in a space between the inner housing 3 and the outer housing 2. The space between the inner housing 3 and the outer housing 2 is filled with a heat insulation material 4. Specifically, in the embodiment, the heat insulation material 4 is cotton, while in other embodiments, the heat insulation material 4 may be other porous or fibrous materials. The inner housing is additionally provided and cooperates with the heat insulation plate to optimize the radial temperature gradient of the monocrystalline silicon, while the space between the outer housing and the inner housing is filled with a heat insulation material to optimize the longitudinal temperature gradient.

In the embodiment, an angle between the plane in which the heat insulation plate 1 is located and the horizontal plane is 30°. In other embodiments, the angle between the plane in which the heat insulation plate 1 is located and the horizontal plane may be any angle greater than 0° and smaller than 30°.

Figure 5:
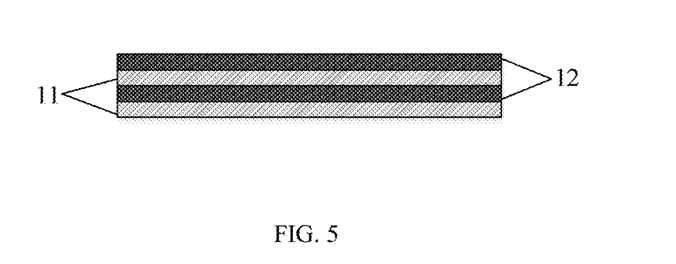
FIG. 5 is a schematic structural diagram of a thin-plate heat insulation plate used in a single crystal production furnace according to the present invention.
Figure 6:
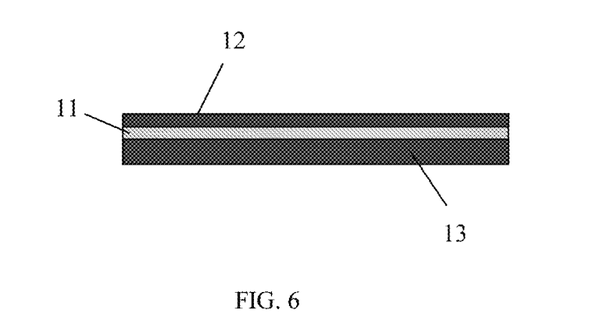
FIG. 6 is schematic structural diagram of a heat insulation plate in a form of composite heat insulation layer used in a single crystal production furnace according to the present invention.

In the embodiment, the heat insulation plate 1 comprises two heat insulation film assemblies. The heat insulation film assemble includes a first refraction layer 11 having first refractivity and a second refraction layer 12 having second refractivity which is different from the first refractivity. In other embodiments, as shown in FIG. 5, the heat insulation plate 1 may be a thin-plate heat insulation plate composed of a plurality of heat insulation film assemblies, or a thin-plate heat insulation plate composed of a plurality of refractive layers with different refractivity. Or, as shown in FIG. 6, the heat insulation plate 1 may be a composite heat insulation plate in a form of a composite heat insulation layer composed of a supporting layer 13 and at least one heat insulation film assembly. Specifically, in the thin-plate heat insulation plate 1, the first refractive layer 11 is made of silicon or molybdenum, and the second refractive layer 12 is made of quartz. In the composite heat insulation plate 1 in a form of a composite heat insulation layer, the first refractive layer 11 is made of silicon, the second refractive layer 12 is made of quartz or silicon nitride, and the supporting layer 13 is made of silicon. The heat insulation plate composed of at least two refractive layers with different refractivity is used to reflect heat emitted from the melt to the periphery of single crystal silicon; the heat insulation plate with such structure has a higher heat reflection efficiency, which is beneficial for optimizing the radial temperature gradient of the monocrystalline silicon.

Further, shells of the outer housing 2 and the inner housing 3 each have a dismountable structure. The shells of the outer housing 2 and the inner housing 3 are made of graphite materials. The dismountable structures of the outer housing 2 and the inner housing 3 can facilitate replacement of the heat insulation plate in the inner shell according to different actual requirements, as well as adjustment of arrangement in each shell according to requirements.

Embodiment 2

Figure 2:
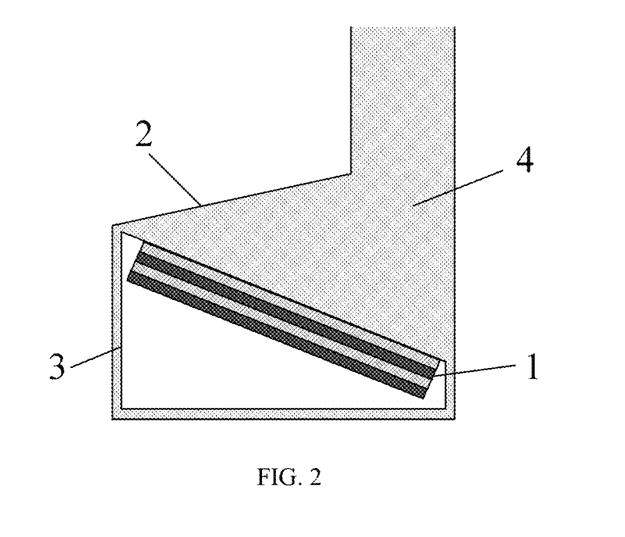
FIG. 2 is a partial section view showing a structure of a heat shield for a single crystal production furnace according to Embodiment 2 of the present invention.

The difference of Embodiment 2 from Embodiment 1 is that the position of the heat insulation plate 1 is different. As shown in FIG. 2, the heat insulation plate 1 in the embodiment is disposed within the inner housing 3. The heat shield structure 8 comprises an outer housing 2 and a heat insulation plate 1. The heat insulation plate 1 is disposed within the outer housing 2 and within the inner housing 3. A bottom outer surface of the outer housing 2 faces interior of the melt crucible 6. An angle formed between a plane in which the heat insulation plate 1 is located and a plane in which a bottom of the outer housing 2 is located is an acute angle and faces an outer surface of monocrystalline silicon 7. An angle between the plane in which the heat insulation plate 1 is located and the horizontal plane is 30°. In other embodiments, the angle between the plane in which the heat insulation plate 1 is located and the horizontal plane may be any angle greater than 0° and smaller than 30°.

Further, an inner housing 3 is further comprised which is provided within the outer housing 2 and in a lower portion of the outer housing 2. The inner housing 3 is provided with a cavity, and the heat insulation plate 1 is provided in the cavity or is provided in a space between the inner housing 3 and the outer housing 2. The space between the inner housing 3 and the outer housing 2 is filled with a heat insulation material 4. Specifically, in the embodiment, the heat insulation material 4 is cotton, while in other embodiments, the heat insulation material 4 may be other porous or fibrous materials. The inner housing is additionally provided and cooperates with the heat insulation plate to optimize the radial temperature gradient of the monocrystalline silicon, while the space between the outer housing and the inner housing is filled with a heat insulation material to optimize the longitudinal temperature gradient. Further, shells of the outer housing 2 and the inner housing 3 each have a dismountable structure. The shells of the outer housing 2 and the inner housing 3 are made of graphite materials. The dismountable structures of the outer housing 2 and the inner housing 3 can facilitate replacement of the heat insulation plate in the inner shell according to different actual requirements, as well as adjustment of arrangement in each shell according to requirements.

In the embodiment, the heat insulation plate 1 comprises two heat insulation film assemblies. The heat insulation film assemble includes a first refraction layer 11 having first refractivity and a second refraction layer 12 having second refractivity which is different from the first refractivity. In other embodiments, as shown in FIG. 5, the heat insulation plate 1 may be a thin-plate heat insulation plate composed of a plurality of heat insulation film assemblies, or a thin-plate heat insulation plate composed of a plurality of refractive layers with different refractivity. Or, as shown in FIG. 6, the heat insulation plate 1 may be a heat insulation plate in a form of a composite heat insulation layer composed of a supporting layer 13 and at least one heat insulation film assembly. Specifically, in the thin-plate heat insulation plate 1, the first refractive layer 11 is made of silicon or molybdenum, and the second refractive layer 12 is made of quartz. In the heat insulation plate 1 in a form of a composite heat insulation layer, the first refractive layer 11 is made of silicon, the second refractive layer 12 is made of quartz or silicon nitride, and the supporting layer 13 is made of silicon. The heat insulation plate composed of at least two refractive layers with different refractivity is used to reflect heat emitted from the melt to the periphery of single crystal silicon; the heat insulation plate with such structure has a higher heat reflection efficiency, which is beneficial for optimizing the radial temperature gradient of the monocrystalline silicon.

Embodiment 3

Figure 3:
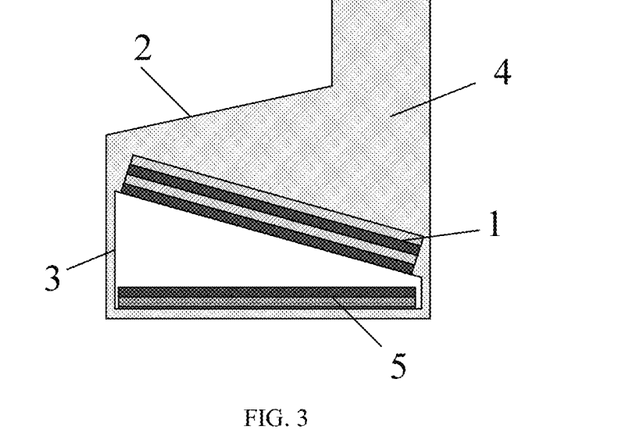
FIG. 3 is a partial section view showing a structure of a heat shield for a single crystal production furnace according to Embodiment 3 of the present invention.

The difference of Embodiment 3 from the above embodiments is that a heat absorbing plate is additionally provided in the heat shield structure. As shown in FIG. 3, a heat shield structure for a single crystal production furnace is provided in the embodiment. The heat shield structure 8 is provided above a melt crucible 6 of a single crystal production furnace and comprises an outer housing 2 and a heat insulation plate 1 disposed within the outer housing 2. A bottom outer surface of the outer housing 2 faces interior of the melt crucible 6, and an angle formed between a plane in which the heat insulation plate 1 is located and a plane in which a bottom of the outer housing 2 is located is an acute angle and faces an outer surface of monocrystalline silicon 7.

A heat absorbing plate 5 and an inner housing 3 are further comprised. The inner housing 3 is provided within the outer housing 2 and in a lower portion of the outer housing 2. The inner housing 3 is provided with a cavity, and the heat insulation plate 1 is provided in the cavity or is provided in a space between the inner housing 3 and the outer housing 2. The space between the inner housing 3 and the outer housing 2 is filled with a heat insulation material 4. The heat absorbing plate 5 is provided within the inner housing 3 and on a bottom of the inner housing 3. An angle between the plane in which the heat insulation plate 1 is located and the plane in which the heat absorbing plate 5 is located is 30°. The angle may be any angle greater than 0° and smaller than 30° in other embodiments. The heat absorbing plate is made of an absorptive composite material. The heat absorbing plate is additionally provided to collect the heat emitted from the melt, which is helpful for subsequently passing the heat to monocrystalline silicon, thereby improving heat transmission efficiency.

Shells of the outer housing 2 and the inner housing 3 each have a dismountable structure. The shells of the outer housing 2 and the inner housing 3 are made of graphite materials. The dismountable structures of the outer housing 2 and the inner housing 3 can facilitate replacement of the heat insulation plate in the inner shell according to different actual requirements, as well as adjustment of arrangement in each shell according to requirements.

In the embodiment, the heat insulation plate 1 comprises two heat insulation film assemblies. The heat insulation film assemble includes a first refraction layer 11 having first refractivity and a second refraction layer 12 having second refractivity which is different from the first refractivity. In other embodiments, as shown in FIG. 5, the heat insulation plate 1 may be a thin-plate heat insulation plate composed of a plurality of heat insulation film assemblies, or a thin-plate heat insulation plate composed of a plurality of refractive layers with different refractivity. Or, as shown in FIG. 6, the heat insulation plate 1 may be a heat insulation plate in a form of a composite heat insulation layer composed of a supporting layer 13 and at least one heat insulation film assembly. Specifically, in the thin-plate heat insulation plate 1, the first refractive layer 11 is made of silicon or molybdenum, and the second refractive layer 12 is made of quartz. In the heat insulation plate 1 in a form of a composite heat insulation layer, the first refractive layer 11 is made of silicon, the second refractive layer 12 is made of quartz or silicon nitride, and the supporting layer 13 is made of silicon. The heat insulation plate composed of at least two refractive layers with different refractivity is used to reflect heat emitted from the melt to the periphery of single crystal silicon; the heat insulation plate with such structure has a higher heat reflection efficiency, which is beneficial for optimizing the radial temperature gradient of the monocrystalline silicon.

The working principle of the embodiment is shown as follows: after the heat emitted from the melt is absorbed by the heat absorbing plate 5, the heat is transferred by the heat insulation plate 1 to an outside periphery of the monocrystalline silicon 7, which is capable of optimizing the radial temperature gradient of the monocrystalline silicon 7, thereby realizing controlling of the pulling rate so as to further improve radial mass uniformity of the monocrystalline silicon.

The present invention has the following beneficial effects:

(1) In the heat shield structure for a single crystal production furnace and the single crystal production furnace, which are simple in structure, the heat shield is changed in design, the heat absorbing plate is additionally provided for transferring the absorbed heat to monocrystalline silicon, and a heat channel is formed in the heat shield, so that the radial temperature gradient of the monocrystalline silicon can be optimized, thereby realizing controlling of the pulling rate and further improving radial mass uniformity of the monocrystalline silicon;

(2) The heat insulation plate composed of at least two refractive layers with different refractivity is used to reflect heat emitted from the melt to the periphery of single crystal silicon; the heat insulation plate with such structure has a higher heat reflection efficiency, which is beneficial for optimizing the radial temperature gradient of the monocrystalline silicon;

(3) The inner housing is additionally provided and cooperates with the heat insulation plate to optimize the radial temperature gradient of the monocrystalline silicon, while the space between the outer housing and the inner housing is filled with a heat insulation material to optimize the longitudinal temperature gradient; and (4) The heat absorbing plate is additionally provided to collect the heat emitted from the melt, which is beneficial for subsequently passing the heat to the monocrystalline silicon, thereby improving heat transmission efficiency.

The principle and embodiments of the present invention are described herein with reference to specific embodiments, and the described of the above embodiments are only for better understanding of the method and the core concept of the present invention. Meanwhile, modifications can be made by those skilled in the art to the embodiments and application according to the spirit of the present invention. In a word, the content of the specification should not be understood as limits to the present invention.

The invention claimed is:

1. A heat shield structure for a single crystal production furnace, wherein the heat shield structure (8) is provided above a melt crucible (6) of a single crystal production furnace and comprises an outer housing (2) and a heat insulation plate (1) disposed within the outer housing (2); a bottom outer surface of the outer housing (2) faces interior of the melt crucible (6), and an angle formed between a plane in which the heat insulation plate (1) is located and a plane in which a bottom of the outer housing (2) is located is an acute angle and faces an outer surface of monocrystalline silicon (7).

2. The heat shield structure for a single crystal production furnace according to claim 1, wherein an inner housing (3) is further comprised, the inner housing (3) is provided within the outer housing (2) and in a lower portion of the outer housing (2); the inner housing (3) is provided with a cavity; the heat insulation plate (1) is provided in the cavity or is provided in a space between the inner housing (3) and the outer housing (2); and the space between the inner housing (3) and the outer housing (2) is filled with a heat insulation material (4).

3. The heat shield structure for a single crystal production furnace according to claim 2, wherein a heat absorbing plate (5) is further comprised, which is provided within the inner housing (3) and on a bottom of the inner housing (3).

4. The heat shield structure for a single crystal production furnace according to claim 3, wherein an angle between a plane in which the heat insulation plate (1) is located and a plane in which the heat absorbing plate (5) is located is in a range of greater than 0° and smaller than or equal to 30°.

5. The heat shield structure for a single crystal production furnace according to claim 1, wherein the heat insulation plate (1) at least comprises two heat insulation film assemblies, and the heat insulation film assemble includes a first refractive layer (11) having first refractivity and a second refractive layer (12) having second refractivity which is different from the first refractivity.

6. The heat shield structure for a single crystal production furnace according to claim 5, wherein the first refractive layer (11) is made of silicon or molybdenum, and the second refraction layer (12) is made of quartz.

7. The heat shield structure for a single crystal production furnace according to claim 1, wherein the heat insulation plate (1) at least comprises a supporting layer (13) and a heat insulation film assembly, and the heat insulation film assembly includes a first refractive layer (11) having first refractivity and a second refractive layer (12) having second refractivity which is different from the first refractivity; and the supporting layer (13), the first refractive layer (11) and the second refractive layer (12) are attached and connected in sequence.

8. The heat shield structure for a single crystal production furnace according to claim 7, wherein the first refractive layer (11) is made of silicon, the second refraction layer (12) is made of quartz or silicon nitride, and the supporting layer (13) is made of silicon.

9. The heat shield structure for a single crystal production furnace according to claim 2, wherein shells of the outer housing (2) and the inner housing (3) each have a dismountable structure.

10. A single crystal silicon production furnace, wherein the single crystal silicon production furnace comprises:
a furnace body including a furnace body wall and an accommodation cavity surrounded by the furnace body wall;
a melt crucible (6) provided within the accommodation cavity and suitable for containing melt;
a heater provided within the accommodation cavity and around the melt crucible (6), and suitable for providing a heat field of the melt crucible (6); and
a heat shield structure for a single crystal production furnace according to claim 1, in which a bottom outer surface of the outer housing (2) faces interior of the melt crucible (6).

11. A single crystal silicon production furnace, wherein the single crystal silicon production furnace comprises:
a furnace body including a furnace body wall and an accommodation cavity surrounded by the furnace body wall;
a melt crucible (6) provided within the accommodation cavity and suitable for containing melt;
a heater provided within the accommodation cavity and around the melt crucible (6), and suitable for providing a heat field of the melt crucible (6); and a heat shield structure for a single crystal production furnace according to claim 2, in which a bottom outer surface of the outer housing (2) faces interior of the melt crucible (6).

12. A single crystal silicon production furnace, wherein the single crystal silicon production furnace comprises:
a furnace body including a furnace body wall and an accommodation cavity surrounded by the furnace body wall;
a melt crucible (6) provided within the accommodation cavity and suitable for containing melt;
a heater provided within the accommodation cavity and around the melt crucible (6), and suitable for providing a heat field of the melt crucible (6); and
a heat shield structure for a single crystal production furnace according to claim 3, in which a bottom outer surface of the outer housing (2) faces interior of the melt crucible (6).

13. A single crystal silicon production furnace, wherein the single crystal silicon production furnace comprises:
a furnace body including a furnace body wall and an accommodation cavity surrounded by the furnace body wall;
a melt crucible (6) provided within the accommodation cavity and suitable for containing melt;
a heater provided within the accommodation cavity and around the melt crucible (6), and suitable for providing a heat field of the melt crucible (6); and
a heat shield structure for a single crystal production furnace according to claim 4, in which a bottom outer surface of the outer housing (2) faces interior of the melt crucible (6).

14. A single crystal silicon production furnace, wherein the single crystal silicon production furnace comprises:
a furnace body including a furnace body wall and an accommodation cavity surrounded by the furnace body wall;
a melt crucible (6) provided within the accommodation cavity and suitable for containing melt;
a heater provided within the accommodation cavity and around the melt crucible (6), and suitable for providing a heat field of the melt crucible (6); and
a heat shield structure for a single crystal production furnace according to claim 5, in which a bottom outer surface of the outer housing (2) faces interior of the melt crucible (6).

15. A single crystal silicon production furnace, wherein the single crystal silicon production furnace comprises:
a furnace body including a furnace body wall and an accommodation cavity surrounded by the furnace body wall;
a melt crucible (6) provided within the accommodation cavity and suitable for containing melt;
a heater provided within the accommodation cavity and around the melt crucible (6), and suitable for providing a heat field of the melt crucible (6); and
a heat shield structure for a single crystal production furnace according to claim 6, in which a bottom outer surface of the outer housing (2) faces interior of the melt crucible (6).

16. A single crystal silicon production furnace, wherein the single crystal silicon production furnace comprises:
a furnace body including a furnace body wall and an accommodation cavity surrounded by the furnace body wall;
a melt crucible (6) provided within the accommodation cavity and suitable for containing melt;

a heater provided within the accommodation cavity and around the melt crucible (6), and suitable for providing a heat field of the melt crucible (6); and a heat shield structure for a single crystal production furnace according to claim 7, in which a bottom outer surface of the outer housing (2) faces interior of the melt crucible (6).

17. A single crystal silicon production furnace, wherein the single crystal silicon production furnace comprises:

a furnace body including a furnace body wall and an accommodation cavity surrounded by the furnace body wall;

a melt crucible (6) provided within the accommodation cavity and suitable for containing melt;

a heater provided within the accommodation cavity and around the melt crucible (6), and suitable for providing a heat field of the melt crucible (6); and a heat shield structure for a single crystal production furnace according to claim 8, in which a bottom outer surface of the outer housing (2) faces interior of the melt crucible (6).

18. A single crystal silicon production furnace, wherein the single crystal silicon production furnace comprises:

a furnace body including a furnace body wall and an accommodation cavity surrounded by the furnace body wall;

a melt crucible (6) provided within the accommodation cavity and suitable for containing melt;

a heater provided within the accommodation cavity and around the melt crucible (6), and suitable for providing a heat field of the melt crucible (6); and a heat shield structure for a single crystal production furnace according to claim 9, in which a bottom outer surface of the outer housing (2) faces interior of the melt crucible (6).

\* \* \* \* \*